United States Patent
Hori

(10) Patent No.: US 7,684,460 B2
(45) Date of Patent: Mar. 23, 2010

(54) SURFACE EMITTING LASER DEVICE

(75) Inventor: Yuichiro Hori, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 12/120,465

(22) Filed: May 14, 2008

(65) Prior Publication Data

US 2008/0285608 A1    Nov. 20, 2008

(30) Foreign Application Priority Data

May 15, 2007    (JP) .................... 2007-128774

(51) Int. Cl.
*H01S 3/08* (2006.01)
(52) U.S. Cl. .............. 372/99; 372/50.11; 372/50.124
(58) Field of Classification Search ............. 372/99, 372/50.11, 50.124
See application file for complete search history.

(56) References Cited

U.S. PATENT DOCUMENTS

| | | | |
|---|---|---|---|
| 6,975,664 B1 * | 12/2005 | Dodabalapur et al. ....... | 372/102 |
| 2006/0245464 A1 * | 11/2006 | Hori et al. ................. | 372/99 |
| 2007/0201526 A1 | 8/2007 | Hori ......................... | 372/50.124 |
| 2007/0201527 A1 | 8/2007 | Hori et al. ................. | 372/50 |
| 2008/0107145 A1 | 5/2008 | Hori et al. ................. | 372/99 |
| 2008/0117942 A1 | 5/2008 | Nagatomo et al. .......... | 372/19 |
| 2009/0010298 A1 * | 1/2009 | Kiyota ....................... | 372/96 |

FOREIGN PATENT DOCUMENTS

| JP | 2000-332351 | 11/2000 |
|---|---|---|
| JP | 2003-023193 | 1/2003 |
| JP | 2003-273456 | 9/2003 |

OTHER PUBLICATIONS

Imada, et al., "Characterization of a Distributed Feedback Laser with Air/Semiconductor Gratings Embedded by the Wafer Fusion Technique", IEEE Journal of Quantum Electronics, vol. 35, No. 9 pp. 1277-1283 (1999).

* cited by examiner

*Primary Examiner*—Minsun Harvey
*Assistant Examiner*—Tod T Van Roy
(74) *Attorney, Agent, or Firm*—Fitzpatrick, Cella, Harper & Scinto

(57) ABSTRACT

A surface emitting laser device can further improve the light emission efficiency thereof to enlarge the degree of freedom of the device. The surface emitting laser device includes an active layer 103, a photonic crystal layer disposed to be adjacent to the active layer, an electrode 108 disposed on the photonic crystal layer, and a plurality of light emitting regions regulated by the electrode. The photonic crystal layer is configured to include a first photonic crystal region 104 disposed just under the electrode, and having a periodic refractive index structure for resonance of light within a plane, and a second photonic crystal region 105 disposed just under the light emitting region, and having a periodic refractive index structure for emitting light in a direction perpendicular to the plane.

12 Claims, 12 Drawing Sheets

⇨ : INCIDENT LIGHT
→ : DIFFRACTION LIGHT

⇨ : INCIDENT LIGHT
→ : DIFFRACTION LIGHT

⇨ : INCIDENT LIGHT
→ : DIFFRACTION LIGHT

⇨ : INCIDENT LIGHT

→ : DIFFRACTION LIGHT

SURFACE EMITTING LASER DEVICE

BACKGROUND OF THE INVENTION

1. Field of the Invention

The present invention relates to a surface emitting laser device.

2. Description of the Related Art

In recent years, a surface emitting laser device has actively been researched. The surface emitting laser has advantages such as being easily integrated and arrayed and having superior coupling efficiency with an external optical system.

Accordingly, the surface emitting laser device is expected to be applied to the fields such as communications, electrophotography, and sensing. In particular, the surface emitting laser device has already been put to practical use in a communication field such as infrared-ray short range communications.

There are several kinds of surface emitting lasers. As a kind of them, there is a laser device realizing a surface emitting function by resonating light in a direction parallel to a substrate to take out oscillated laser light by diffracting the laser light into a direction perpendicular to the substrate.

As such a diffraction type surface emitting laser, a first patent document (Japanese Patent Application Laid-Open No. 2000-332351) discloses an invention using a second-order diffraction effect of a two-dimensional photonic crystal.

In this invention, the photonic crystal is introduced in the neighborhood of the active layer of a semiconductor laser, and the light emitted in the active layer is oscillated within a plane by the second-order diffraction effect of the photonic crystal.

Then, the surface emitting laser is configured to take out the oscillated laser light into a direction perpendicular to the plane by the first-order diffraction of the same photonic crystal.

The development of a surface emitting laser having further higher performance has strongly been desired recently, and the aforesaid related art grating surface emitting laser device disclosed in the first patent document also has room for further improvement in the points of the degree of freedom of the design of the laser and the light emission efficiency thereof.

SUMMARY OF THE INVENTION

The present invention is directed to a surface emitting laser device capable of further improving the light emission efficiency thereof and enlarging the degree of freedom of the design thereof.

According to the present invention, a surface emitting laser device capable of further improving the light emission efficiency thereof and enlarging the degree of freedom of the design thereof can be realized.

Further features of the present invention will become apparent from the following description of exemplary embodiments with reference to the attached drawings.

BRIEF DESCRIPTION OF THE DRAWINGS

FIGS. 5A and 5B are views illustrating a photonic crystal layer in the first example of the present invention, in which FIG. 5A is a sectional view illustrating the whole photonic crystal layer in the surface emitting laser when it is viewed from the direction perpendicular to the substrate and FIG. 5B is an enlarged view of a region 503 illustrated in FIG. 5A.

FIGS. 6A and 6B are views illustrating a first photonic crystal region in the first example of the present invention, in which FIG. 6A is a schematic diagram illustrating photonic bands and a resonance mode in the first photonic crystal region and FIG. 6B is a schematic diagram illustrating of the diffraction of a light in the resonance mode.

FIGS. 7A, 7B, and 7C are views illustrating photonic bands of a second photonic crystal region in the first example of the present invention, in which FIG. 7A is a schematic diagram illustrating the photonic bands and a resonance mode in the second photonic crystal region, FIG. 7B is a schematic diagram illustrating the diffraction of a light perpendicular to a plane in the resonance mode, and FIG. 7C is a schematic diagram illustrating the diffraction of a light in a direction parallel to the plane in the resonance mode.

FIGS. 9A and 9B are views illustrating photonic bands in the first photonic crystal region introduced in the surface emitting laser of the present invention, in which FIG. 9A is a schematic diagram illustrating the photonic bands and another resonance mode in the first photonic crystal region and FIG. 9B is a schematic diagram illustrating the diffraction of light in the resonance mode.

FIGS. 12A and 12B are views illustrating a photonic crystal layer and p electrodes in the third example of the present invention, in which FIG. 12A is a plan view illustrating the whole photonic crystal layer in the surface emitting laser when it is viewed in the direction parallel to the substrate and FIG. 12B is a plan view of the laser device when it is viewed from above.

FIGS. 14A and 14B are views illustrating a photonic crystal layer in the fourth example of the present invention, in which FIG. 14A is a view illustrating the whole photonic crystal layer in the surface emitting laser and FIG. 14B is an enlarged view of a region 1404 in FIG. 5A.

DESCRIPTION OF THE EMBODIMENTS

A surface emitting laser device of an exemplary embodiment of the present invention is next described.

Figure 1:
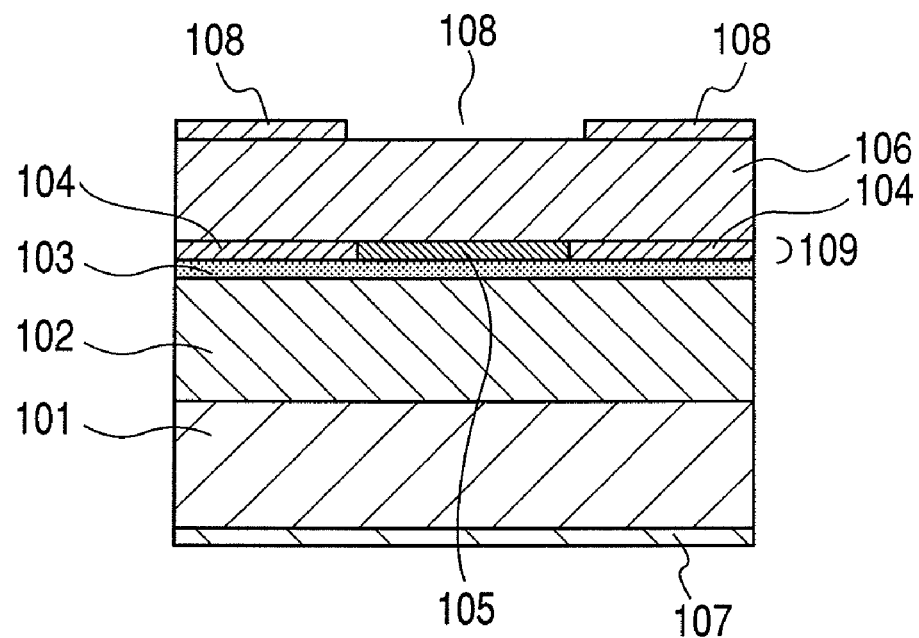
FIG. 1 is a sectional view illustrating the basic configuration of a surface emitting laser of an exemplary embodiment of the present invention.

FIG. 1 is a conceptual diagram illustrating a laser device of the present exemplary embodiment, but the present invention is not limited to this configuration.

As illustrated in FIG. 1, the laser device includes a substrate 101, a lower cladding layer 102, an upper cladding layer 106, and an active layer 103. Moreover, the laser device further includes a photonic crystal layer 109, regions of a first periodic structure 104, a region of a second periodic structure 105, a lower electrode 107, and upper electrodes 108.

In the present exemplary embodiment, a surface emitting laser device including an active layer, a photonic crystal layer disposed to be adjacent to the active layer, an electrode formed on the photonic crystal layer, and a light emitting region emitting light is configured. At that time, a two-dimensionally periodic refractive index structure (two-dimensional photonic crystal) is used as the photonic crystal layer.

The photonic crystal is a structure made of a material having a periodic refractive index in the order of the wavelength of light, and can control the light propagating in the crystal by controlling design parameters.

The photonic crystal can be classified into one-dimensional, two-dimensional, and three-dimensional photonic crystals on the basis of the directions along which the periodic refractive index is formed.

The present exemplary embodiment uses the two-dimensional photonic crystal among them.

Figure 2:
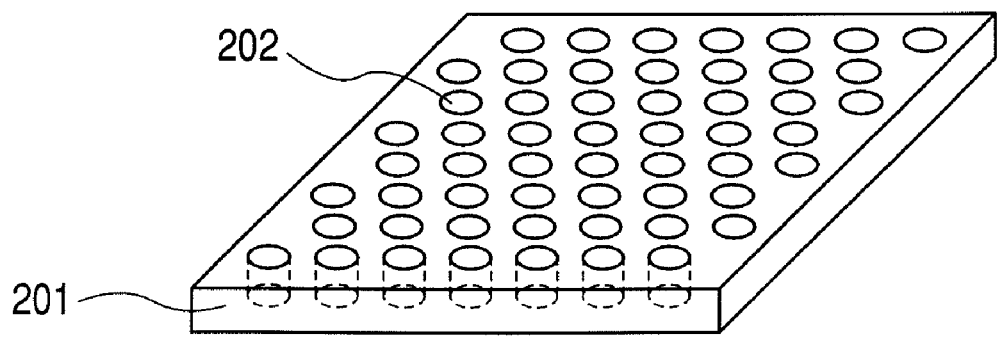
FIG. 2 is a perspective view illustrating a two-dimensional photonic crystal of the exemplary embodiment of the present invention.

As an example of the two-dimensional photonic crystal, for example, a photonic crystal illustrated in FIG. 2 is well known. The photonic crystal includes a thin planer medium 201 in which holes 202 are periodically formed. The photonic crystal is called as an air hole type slab photonic crystal.

By providing the two-dimensional photonic crystal in the neighborhood of the active layer of a semiconductor laser, the photonic crystal can be used as a resonance mirror within the plane and as a diffraction grating diffracting oscillated light into the direction perpendicular to a plane thereof.

To put it concretely, the surface emitting laser device of the present exemplary embodiment performs surface emitting as follows. The light emitted from the active layer of the laser device is chiefly confined in the active layer, and a part of the light is also confined in the photonic crystal layer in the neighborhood of the active layer.

The light in the photonic crystal layer is diffracted and resonates within the plane owing to the periodic structure of the refractive index, and oscillates owing to the gain of the active layer. At this time, only the light of the mode and the wavelength that are under the best resonance conditions to the period of the refractive index generates laser oscillation.

The oscillated laser light receives diffraction by the photonic crystal into the direction perpendicular to the plane, and performs surface emitting. The aforesaid first patent document describes the surface emitting laser device driven by the principle like this.

The present exemplary embodiment is characterized in that the photonic crystal layer provided in the neighborhood of the active layer is functionally divided into two or more regions.

That is, the photonic crystal layer is separated into the regions in each of which light is resonated within the plane (first photonic crystal regions), and a region in which light is emitted into the direction perpendicular to the plane (second photonic crystal region).

In the following, the function of the photonic crystal in the present exemplary embodiment is described.

In the present embodiment, a case of forming cylindrical holes in a square lattice in a medium having a refractive index of 3.45 is illustratively described.

The heights of the cylinders are in the order of 100 nm to 200 nm to be small, and the parts other than the cylinder portions (that is, the region including the high refractive index medium portion of the two-dimensional photonic crystal and the adjacent cladding) are made of the medium having the refractive index of 3.45. The cladding layer is thick to be 1 μm to 2 μm.

Figure 3:
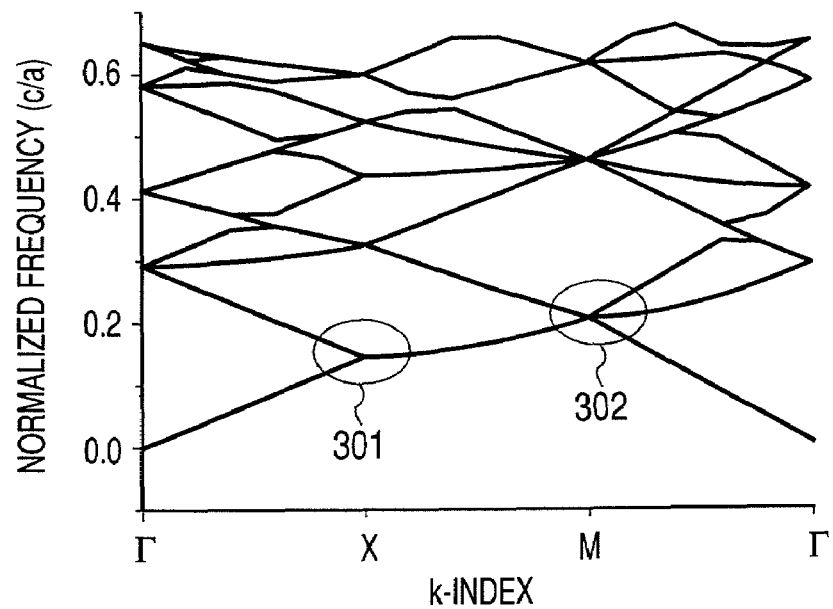
FIG. 3 is a schematic diagram illustrating a photonic band structure of the exemplary embodiment of the present invention.

FIG. 3 is a diagram illustrating the photonic bands calculated by using an effective refractive index approximation in the case of introducing a photonic crystal (PhC) at the position illustrated in FIG. 1.

The photonic band diagram illustrates a state of the frequency dispersion of the grating propagating in the crystal in a momentum space.

In FIG. 3, because the resonance mode at a Γ point includes primary diffraction into a direction perpendicular to the plane in addition to the resonance within the plane, the laser light that has resonated and oscillated in the plane of the photonic crystal is taken out into the direction perpendicular to the plane. The mode at Γ point is usually used for laser oscillation.

However, the resonance occurs only in the direction in the plane and no light can be taken out into the direction perpendicular to the plane, in a mode (regions 301 and 302 severally enclosed by a circle in FIG. 3) lower than a light line (denoted by dotted line in FIG. 3) in a photonic band among the points (X point, M point) each having high symmetry other than the Γ point.

Because the diffraction in the direction perpendicular to the plane is important when the surface emitting of laser light is performed but is a loss in the resonance within the plane for oscillation, it is more efficient to perform resonance only within the plane at the time of laser oscillation.

For all of these reasons, the function of the photonic crystal is separated into the regions, in one of which light is mainly resonated within a plane (first photonic crystal regions) and in the other of which light is emitted to the direction perpendicular to the plane (second photonic crystal region) in the present embodiment.

Then, the first photonic crystal regions are formed under electrodes, and the second photonic crystal region is formed just under a light emitting region.

In the case of FIG. 1, the first photonic crystal regions correspond to the first photonic crystal regions 104 (hereinafter also referred to as "regions 104"), which are the dedicated regions for the resonance within the plane. Moreover, the second photonic crystal region corresponds to the second photonic crystal region 105 (hereinafter also referred to as "region 105"), which is the region attaching importance to the diffraction in the direction perpendicular to the plane.

Accordingly, the photonic crystals having the aforesaid modes lower than the light line other than the Γ point are formed in the regions 104 of the first periodic structures, and the photonic crystal having the mode at the Γ point is formed in the region 105 of the second periodic structure.

By adopting such a configuration, it is possible to generate laser oscillation more efficiently.

Moreover, by distributing the two functions of photonic crystals, the resonance within the plane and the diffraction in the direction perpendicular to the plane, to different photonic crystals severally, it can be performed to design the laser device and the photonic crystals with the parameters mainly optimized to the respective functions, and the degree of freedom of the design becomes larger.

The selection of modes in the band diagram can be performed by suitably designing the parameters, such as the lattice constants and the hole radii of the photonic crystals.

Moreover, because it is needed to conform the directions of momentum vectors of resonance lights to one another, it is necessary to suitably adjust the directions of the periodic structures in the photonic crystals.

Moreover, the coupling efficiencies of the boundary portions of the photonic crystals are not 100% at this time, and a part of the lights is reflected at the interfaces of the photonic crystals.

However, in such a case, the phase of a propagation light reflected by a boundary surface to a region 104 can accord with the phase of the resonating light in the region 104.

Furthermore, the reflection at a boundary can be controlled by forming a reflection controlling structure at a boundary of a region 104 and the region 105.

Also in this case, the phase of a propagation light reflected from a boundary surface to a region 104 can accord with a resonance light in the region 104.

The reflection controlling structure that can be formed at this time can adopt the following form. For example, a groove of one layer shaped in a straight line or a curved line is dug in the plane in the boundary surface of two regions and media having different refractive indices from each other are filled up. Thus, it can be adjust the reflection controlling the width of the groove and the differences of the refractive indices.

Alternatively, there is also a method of adjusting reflectance by forming a plurality of grooves every quarter wavelength of light.

Moreover, because no mechanisms for preventing the leakage of light are provided at the outer boundary parts of the regions 104 (such as in mesa grooves) other than the boundary between the region 104 and 105, a reflection mechanism can suitably be provided on the outside of the region 104.

By forming a groove of an optical thickness other than $\lambda/2$ (since $\lambda/2$ is the wavelength of a antireflection) in the photonic crystal parts, the reflection mechanism can be configured. Moreover, by enclosing the peripheries of the regions 104 with a photonic crystal or a grating structure for reflection, the reflection mechanism can be configured.

The two-dimensionally periodic refractive index structure (photonic crystal) is used in the present exemplary embodiment, and light is two-dimensionally guided into many directions.

Consequently, when the above-mentioned configuration is adopted, oscillated lights are uniformly supplied from one or more directions to the region 105. On the other hand, lights are supplied only from two directions in a one-dimensionally periodic structure. Consequently, the efficiency of taking out light is higher in the case of the two-dimensionally periodic refractive index structure than in the case of the one-dimensionally periodic refractive index structure. Furthermore, if the region 105 is formed on an edge side of a photonic crystal region and the feed passages of light from region 14 are intercepted in one direction or two directions, then the used of the two-dimensionally periodic structure enables an usage of the other feed passages of light, and enables the configuration capable of supplying oscillated light to the region 105 more effectively than the case of using the one-dimensionally periodic structure.

Moreover, the whole spontaneous emission emitted from the active layer to the directions other than the direction of the periodic structure in the one-dimensionally periodic structure essentially becomes the loss that does not contribute to oscillation. Because the loss is reduced owing to the occurrence of feedback in many directions in the two-dimensionally periodic structure, the efficiency of supplying oscillated light is improved rather than that in the one-dimensionally periodic structure.

Furthermore, because the active layer beneath the region 105 in FIG. 1 works as a light absorbing layer, the activation region can suitably be removed in view of the efficiency of the laser device.

Moreover, although the photonic crystal layer 109 including the regions 104 and 105 is formed on the upper side of the active layer in the configuration illustrated in FIG. 1, the photonic crystal layer 109 can be formed on the lower side of the active layer. Furthermore, two or more photonic crystal layers can be formed on both the upper and lower sides of the active layer.

Moreover, the photonic crystals in the regions 104 and 105 can be formed in layers that are not on the same plane. For example, a configuration is conceivable in which the regions 104 are disposed on the lower side of the active layer and the region 105 is disposed on the upper side of the active layer. The configuration will be described with regard to a second example below.

Moreover, two or more light diffracting portions can be formed independently from each other as the regions 105. The phase of the light emitted from each of the region 105 is adjusted, and the lights are emitted from all the apertures of region 105 in the same phase. Accordingly, the lights can be used as monitoring lights. The configuration will be described as a third example below.

In the above, only the example of the photonic crystal configured by forming the low refractive index media (holes) in the high refractive index medium has been described. But, the configuration in which high refractive index media are introduced in a low refractive index medium may be adopted.

A configuration in which the low refractive index media introduced into the high refractive index medium are formed in, for example, a triangle lattice, a square lattice, or expanded shapes on a concentric circle can be adopted.

Alternatively, various configurations in which the low refractive index media are formed in a quasi-crystalline structure or introduced quite randomly with distances shorter than a certain length from each other can be adopted.

Moreover, a low dielectric constant medium can take the shapes, such as a cylinder, a square pole, a triangle pole, and an elliptic cylinder.

Moreover, although the cases of the configurations using the two media of the high refractive index medium and the low refractive index media have been examined above, the cases of further introducing a third and a fourth media can be considered by expansion.

Furthermore, the materials constituting the photonic crystal regions will be described.

The photonic crystal can be made by using the materials such as a semiconductor, a dielectric, and a metal.

Moreover, an electrically conductive transparent conductive medium or the like can also be used. The photonic crystal can be configured by arranging two or more kinds of arbitrary different materials periodically.

However, in the case of driving a device by current injection, at least one of the materials to be adopted can suitably be a conductive semiconductor, a conductive metal, or a transparent conductive medium.

The positions of the photonic crystal regions can suitably be configured to be as close as possible to the position of the active layer (being adjacent to the active layer). That is, it is needed to provide the photonic crystals at the positions where the photonic crystals can be coupled with the light emitted from the active layer.

Moreover, if the active layer itself functions as the photonic crystal, then such a configuration is most preferable.

As the materials of usable semiconductors, III-V group semiconductors, such as GaAs, AlGaAs, AlInGaP, GaInAsP, GaInNAs, GaN, AlN, and InN, and arbitrary mixed crystals of them can be cited.

Moreover, besides them, II-VI group semiconductors, such as ZnSe, CdS, and ZnO, and arbitrary mixed crystals of them can be cited. Moreover, various organic semiconductors can also be used. In the dielectrics, many materials such as $SiO_2$, $TiO_2$, $Al_2O_3$, $Nb_2O_5$, $CeO_2$, $ZrO_2$, and $HfO_2$ can be used.

In metals, all solid metallic crystals, such as Au, Ag, Cr, and Co, can be used.

Moreover, as the transparent conductive media, Indium Tin Oxide (ITO), which is a transparent conductive oxide, $SnO_2$, $In_2O_3$, ZnO, and the like can be cited. As the components of the photonic crystal mirror, media that are transparent to the oscillation wavelengths or absorb little light can be used.

Accordingly, the semiconductors or the dielectrics that are transparent to the oscillation wavelengths can be used suitably.

The configuration of the electrodes and the carrier injection method into the active layer in the present exemplary embodiment are described.

In the present embodiment, a pair of electrodes of an anode and a cathode is provided, and carriers are injected into the active layer by the carrier injection from the electrodes.

The electrodes cover all of the regions 104 in the direction of emitting light (hereinafter the direction is referred to as upper direction).

Then, in the upper direction of the region 105, no electrodes are provided to be an aperture. No aperture is formed in the reverse direction (hereinafter referred to as lower direction) to the oscillation direction of light.

By adopting such a configuration, carries can efficiently be supplied to the regions 104, which are for oscillations, and the light emitted from the region 105 for diffraction can be emitted without being interrupted.

As the materials constituting the electrodes, all of the metal materials including the materials used for the conventional semiconductor laser processes can be used.

For example, the materials of Au—Ge—Ni and Au—Ge—Pt are used for the n electrode of GaAs, and the material of Ag—Zn and Au—Zn are used for the p electrode.

Moreover, conductive transparent oxide materials, such as ITO, $SnO_2$, and $InO_2$ can also be used for the electrodes besides metals.

The active layer and the cladding layers of the surface emitting laser device of the present embodiment are next described.

The double heterostructure, the multiple quantum well structure, the strained quantum-well structure, the quantum-dot structure, and the like, which are used for a semiconductor laser, can be applied to the active layer.

In this case, the semiconductor materials to be used for the active layer are the same as those described above.

Moreover, gain media for a solid state laser, such as Ti:Sapphire and Nd:YAG (Yittrium Garnet) can also be used.

Moreover, a separate confinement heterostructure (SCH) layer for confining oscillating lights can also be introduced between the active layer and the cladding layers.

The cladding layers are introduced at the upper and lower positions of the active layer put between them. In the present exemplary embodiment, the upper cladding layer is adjacent to the photonic crystal layer, but the photonic crystal is sometimes formed in the cladding layer.

The materials such as semiconductors, dielectrics, and transparent conductors can be used. When the device is driven by the current injection, the cladding layers can suitably be made of a semiconductor, a transparent electrode, and the like.

In this case, it is necessary that one of the upper and lower cladding layers is doped to be an n type semiconductor, and that the other of them is doped to be a p type semiconductor. Then the semiconductor layers supplies carriers to the active layer. The concrete materials of the semiconductors, the dielectrics, and the transparent conductors are the same as those described above.

EXAMPLES

First Example

Figure 4:
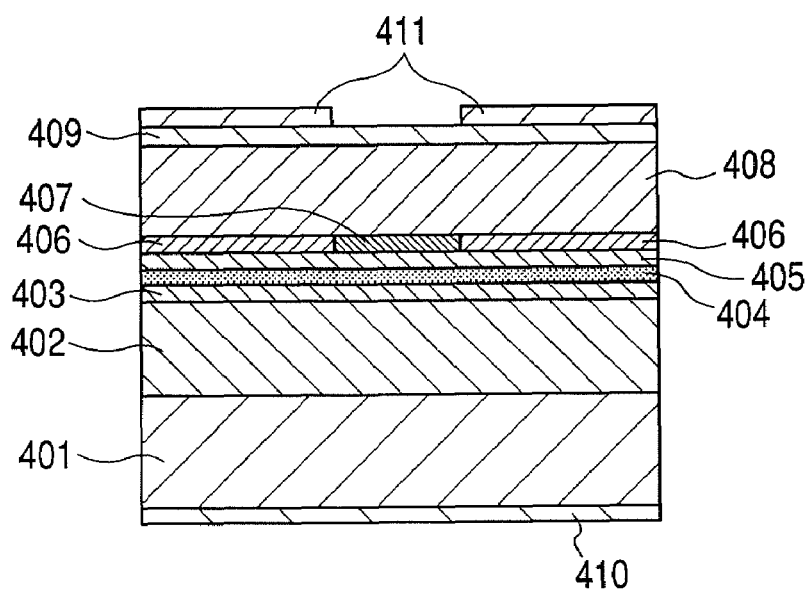
FIG. 4 is a sectional view illustrating the configuration of a surface emitting laser of a first example of the present invention when it is viewed from the direction parallel to the substrate thereof.

A surface emitting laser device to which the present invention is applied is described in a first example. FIG. 4 is a view illustrating the configuration of the surface emitting laser of the present example.

FIG. 4 is a sectional view illustrating the configuration of the surface emitting laser of the present example when it is viewed in the direction parallel to the substrate thereof.

As illustrated in FIG. 4, the surface emitting laser includes the substrate 401, a lower cladding layer 402, a lower SCH layer 403, an active layer 404, and an upper SCH layer 405.

The surface emitting laser further includes a first photonic crystal region 406 and a second photonic crystal region.

The surface emitting laser still further includes an upper cladding layer 408, an electrode contact layer 409, an n electrode 410, and a p electrode 411.

In the present example, the substrate was a GaAs substrate, and the thickness thereof was set to be 525 μm.

The lower and upper cladding layers were n type and p type $(Al_{0.5}Ga_{0.3})_{0.5}InP$, respectively, and had the thicknesses of 2.0 μm and 1.0 μm, respectively.

The lower and upper SCH layers were n type and p type $(Al_{0.5}Ga_{0.5})_{0.5}InP$, respectively, and had a thickness of 50 nm.

The active layer was formed in a non-doped $(Al_{0.5}Ga_{0.5})_{0.5}InP/In_{0.56}Ga_{0.44}P$ multiple quantum well structure, and the number of wells were 3 layers, each having the layer thickness of 6 nm. The materials of the upper cladding layer and a cap layer were GaAs, and their thicknesses were severally 10 nm.

The materials of the n electrode and the p electrode were Au—Zn and Au—Ge—Ni, respectively.

The photonic crystal layer (the layer including the first photonic crystal region 406 and the second photonic crystal region 407) had a thickness of 150 nm and was made of p type $(Al_{0.5}Ga_{0.5})_{0.5}InP$.

In the device of the present example, the method of arranging the photonic crystals was important. In the following, the method will be described.

Figure 5A:
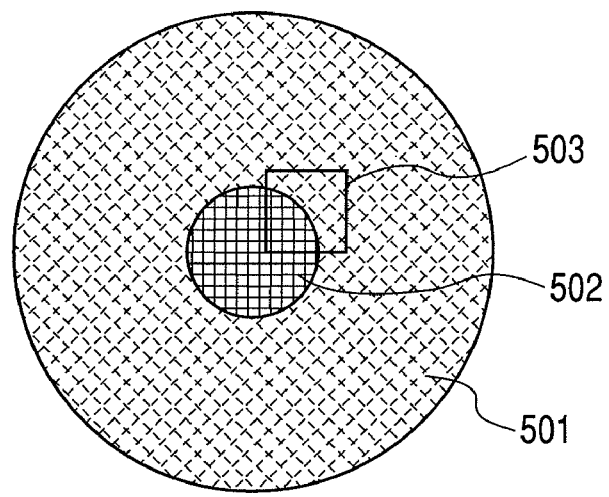
Figure 5B:
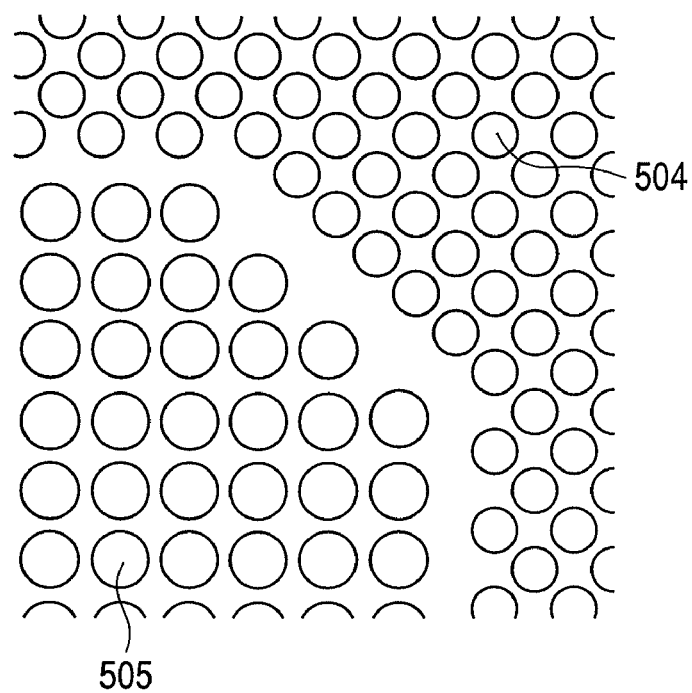

FIGS. 5A and 5B are views illustrating the photonic crystal layers of the present example.

FIG. 5A is a sectional view illustrating the whole of the photonic crystal layers in the surface emitting laser when it is viewed from the direction perpendicular to the substrate thereof.

As illustrated in FIG. 5A, the photonic crystal layers includes a first photonic crystal region 501 and a second photonic crystal region 502. A region illustrated in FIG. 5B is expressed by an enclosure 503 in FIG. 5A.

FIG. 5B is an enlarged view of the region 503 illustrated in FIG. 5A.

As illustrated in FIG. 5B, the region 503 includes first photonic crystal region holes 504 and second photonic crystal region holes 505.

In the present example, the configuration in which the second photonic crystal region 502 was enclosed by the first photonic crystal region 501 was adopted.

In this case, the first photonic crystal was the photonic crystal for oscillation, and the second photonic crystal was the photonic crystal for laser light diffraction.

It is the same way as the one described with regard to the exemplary embodiment of the invention on what principle these two kinds of photonic crystals function.

In the present example, both the first and second photonic crystal regions were configured of a photonic crystal including a medium with cylindrical holes in a square lattice.

The period of holes and the radius of each of the holes of the first photonic crystal region were 135 nm and 30 nm, respectively. The period of holes and the radius of each of the holes of the second photonic crystal region were 200 nm and 20 nm, respectively.

Figure 6A:
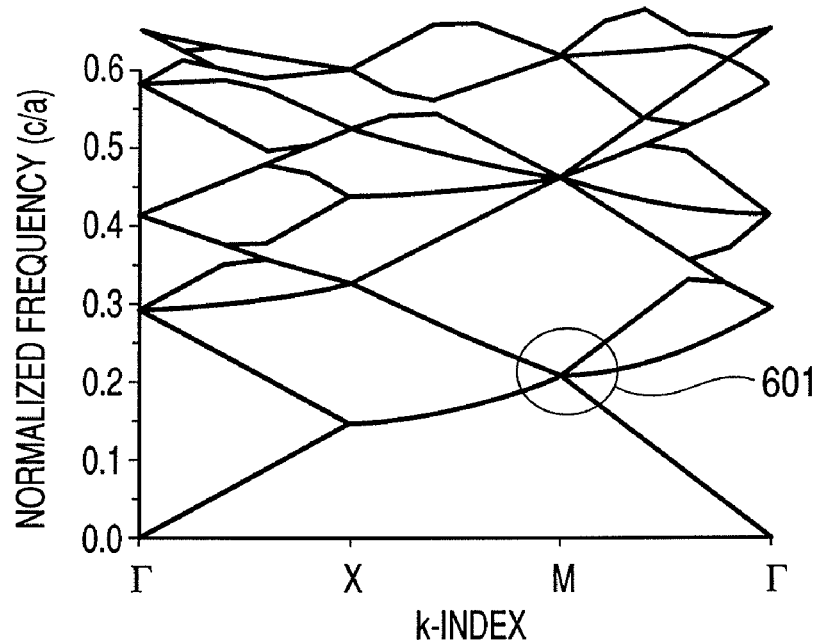
Figure 7A:
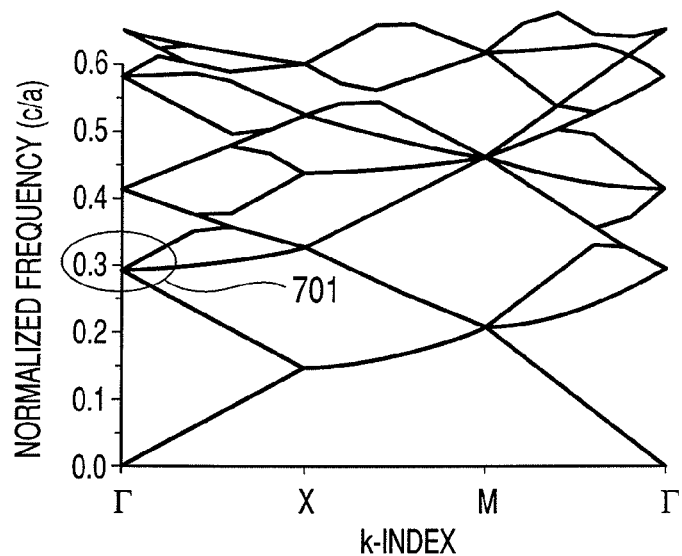

These photonic crystal parameters were introduced by the following point of view. FIGS. 6A and 7A illustrate the photonic band diagrams of the first and second photonic crystal regions, respectively.

Each of the photonic bands was calculated by a two-dimensional plane-wave expansion method using an effective refractive index approximation, and both of the photonic bands were obtained by the calculations in the photonic crystals having square gratings and the cylindrical holes.

Both the photonic crystals had the holes of different radii from each other to the lattice constants. The ordinate axes indicate the frequencies normalized by the lattice constants of the photonic crystals.

Figure 6B:
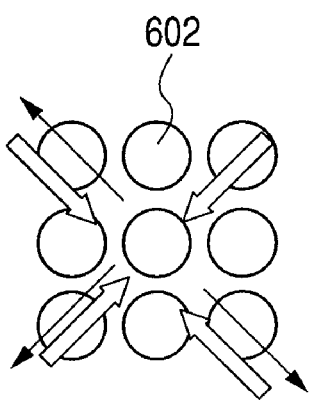

With reference to FIGS. 6A and 6B, the first photonic crystal region 501 is described. FIG. 6A is a photonic band diagram in the region, and the used mode is expressed by an enclosure line 601.

FIG. 6B is a schematic diagram illustrating the state in which a propagating light was diffracted in the first photonic crystal region 501 including photonic crystal holes 602.

In the photonic crystal region, as illustrated in FIG. 6A, the mode of the photonic band at an M point was used.

The diffraction of light within a plane here occurred in the directions of the diagonal lines of the unit cell in the photonic crystal. For example, the incident light (white arrow) from the lower left direction illustrated in FIG. 6B could be diffracted to three black arrow directions at the grating point.

The incident lights from the other three directions were diffracted in similar relations.

The diffraction lights of the incident light only from the lower left direction are illustrated here in order to prevent the complexity of the illustration.

The lights diffracted at the grating point were further diffracted into three directions, and the multiple diffraction in the diagonal line directions of the square lattice was continually occurring in the region.

In the mode at the M point enclosed by the line 601, these lights severally formed a standing wave, and had resonance effects in the photonic crystal.

Figure 7B:
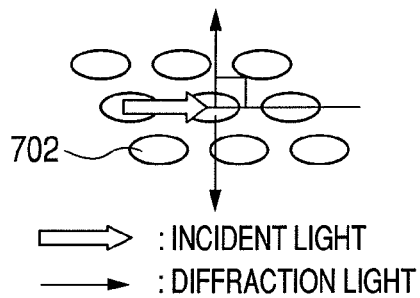
Figure 7C:
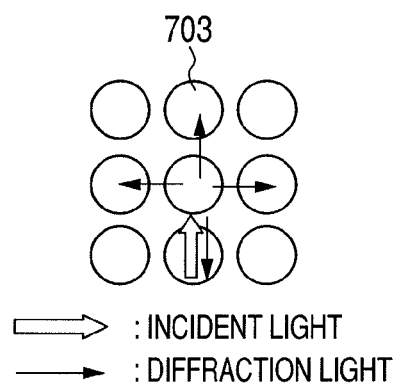

With reference to FIGS. 7A, 7B, and 7C, the second photonic crystal region 502 is described.

FIG. 7A is a photonic band diagram in the region, and the used mode is expressed by an enclosure line 701.

FIGS. 7B and 7C are schematic diagrams illustrating the states in which propagation lights were diffracted in the second photonic crystal region 502, which includes photonic crystal holes 702 and 703.

In the photonic crystal region, as illustrated in FIG. 7A, a mode at a Γ point in the photonic bands.

Then, as illustrated in FIG. 7B, a light met the Blagg condition in the direction perpendicular to a photonic crystal surface and was diffracted into the direction here.

Moreover, as illustrated in FIG. 7C, diffraction occurred in the direction of periodicity in the crystal within the plane direction. In the plane direction, each of the lights diffracted into four directions at the grating point by multiple diffraction and was in a standing wave state similarly to being in the first photonic crystal region.

The considerations may be performed only to the lights diffracted in the direction perpendicular to the plane in the second photonic crystal region. Because the diffracted lights in the perpendicular direction are the loss of the laser, the diameters of holes can be reduced as small as possible, and emitted components can be reduced as little as possible for lowering the threshold value thereof. However, if the threshold value is lowered too much, no diffraction occurs. Consequently, the threshold value is needed to be suitably adjusted.

The lattice constants of the photonic crystals were obtained from the normalized frequencies of the photonic bands in consideration of the desired frequency (670 nm) in both of the first and second photonic crystal regions.

In order to obtain single mode resonance, the lattice constant of the first photonic crystal region 501 was about $1/\sqrt{2}$ of that of the second photonic crystal region 502.

Moreover, in the second photonic crystal region 502, the hole radii were determined so that the diffraction efficient into the perpendicular direction to substrate might be appropriate. Because the diffraction efficient became smaller as the hole radii became smaller, the optimum point was found by gradually reducing the hole radii. In the present example, the hole radii was set to be 10% of the lattice constant.

In the boundary regions of the photonic crystals, it was required to meet the energy conservation law and the momentum conservation law when a light propagated from the region 501 to the region 502.

The energy conservation law could be met by adjusting the lattice constants so that the frequencies of the resonance modes might accord with each other in the regions 501 and 502 as described above.

The momentum conservation law could be met by adjusting the crystal orientations so that the propagation directions of the resonance modes might accord with each other in the regions 501 and 502.

As illustrated in FIGS. 6B and 7B, because the directions of the propagation lights were determined here, the conditions mentioned above could be met by adjusting the mutual crystal orientations might rotate by 45° in the regions 501 and 502.

The structure of the p electrode in the present example is next described with reference to FIG. 8.

Figure 8:
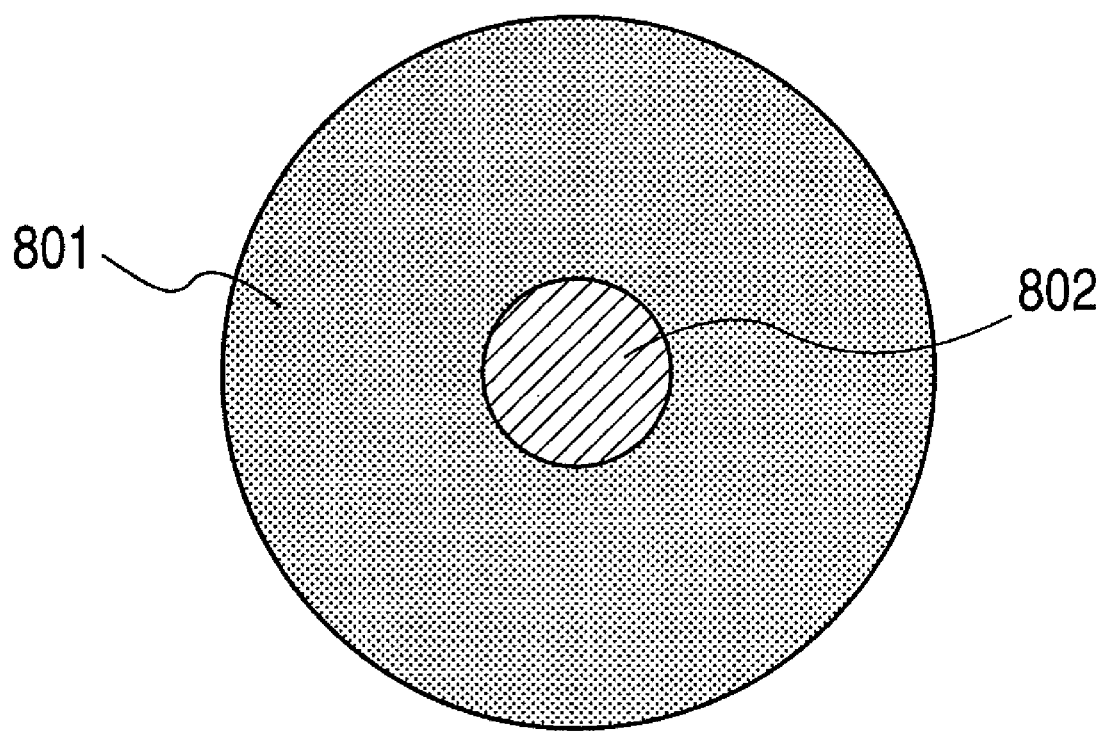
FIG. 8 is a plan view illustrating a laser device illustrating a p electrode in the first example of the present invention when it is viewed from above.

FIG. 8 is a view of the laser device of the present example when it is viewed from above. The laser device included a p electrode 801, and an aperture portion 802. The electrode covered the upper portion of the first photonic crystal region 501, which was the laser oscillation region, and supplied carriers, as described with regard to the exemplary embodiment of the present invention.

Moreover, no electrode was provided on the upper part of the second photonic crystal region 502, which worked for light diffraction, and formed to be an aperture.

The laser light diffracted in the second photonic crystal region was emitted form the aperture portion. Because the current from the electrode diffused also to the aperture portion side, the area of the aperture portion could be formed to be larger than the second photonic crystal region.

The manufacturing method of the device is next described.

The laser device of the present example could be manufactured by the method of EB lithography, dry etching, a wafer fusing technology, and the like, in addition to the well known semiconductor laser manufacturing processes.

When the laser device of the present example was electrified, a laser light having the wavelength of 670 nm was emitted form the aperture portion.

Figure 9A:
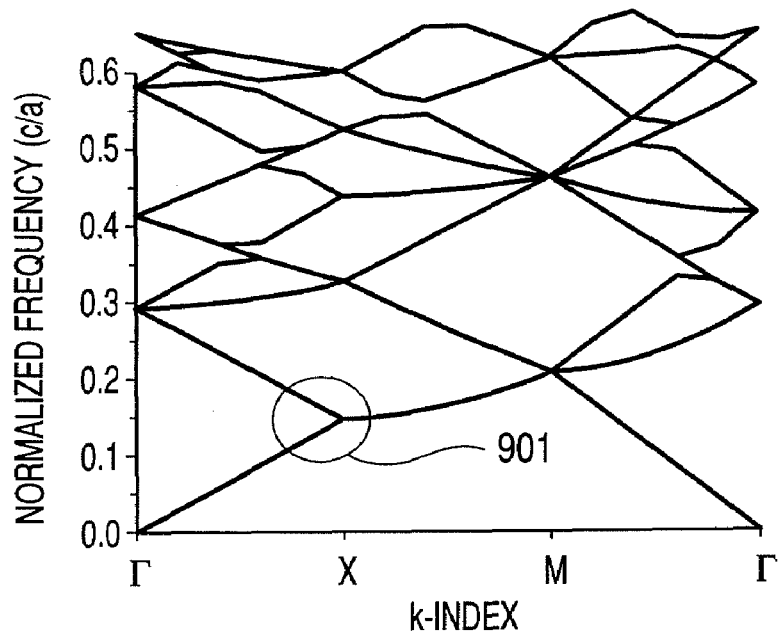

Although the parameters of the first photonic crystal region was configured so as to use the mode at the M point in the present example, the mode at an X point could also be used as illustrated in FIG. 9A.

Figure 9B:
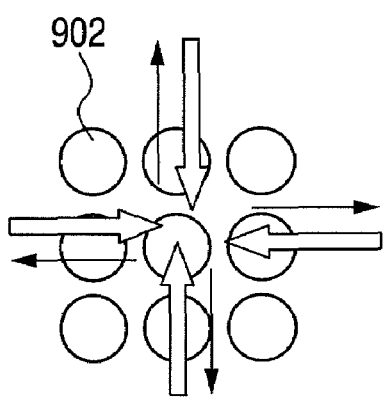

In this case, the resonance directions of light were four directions illustrated in FIG. 9B, and the respective incident lights were diffracted only to the opposite directions. The modes that were coupled with each other were only two directions of the longitudinal direction and the lateral direction of FIG. 9B.

The resonance directions of the lights to the crystal orientations were the same as those of the second photonic crystal, and consequently the crystal orientations were equal to each other in the first and second photonic crystal regions.

In the present example, AlGaAs/AlGaInP series compound semiconductors were used as the materials for configuring the device, and the multiple quantum well structure of AlGaInP/GaInP was used for the active layer. But, the other material series could be used for the configuration.

As the other material series, all of the semiconductor materials, such as GaN, InN, and AlN, which were cited in the exemplary embodiment of the invention, could be used.

Moreover, all of the materials of the transparent conductive media, the dielectrics, the metals, and the like, cited in the exemplary embodiment, could be used.

Moreover, although the photonic crystals in the shape of square gratings were used in the present example, the shape might be formed as a triangle grating.

In the case of the triangle grating, the crystalline arrangement and the lattice constants were determined in consideration of the diffraction directions and the resonance wavelengths similarly to the case of the crystal square grating.

To put it concretely, the following two cases existed.

As one of them, the case where the lattice constant of the first photonic crystal was about a half of that of the second photonic crystal and the crystal orientations were equal to each other existed.

As the other one of them, the case where the lattice constant of the first photonic crystal was about $1/\sqrt{3}$ of that of the second photonic crystal and the mutual crystal orientations were rotated by 30° existed.

Moreover, all the crystal structures described in the exemplary embodiment of the invention could be adopted besides the crystal structures described above.

Moreover, in the present example, each of the holes was formed in a circular cylinder type hole, but the photonic crystals of the forms, such as polygonal holes, which were described in the exemplary embodiment of the invention, could all be used.

Furthermore, sub-gratings for putting the objective properties of the photonic crystals into disorder could be introduced.

Moreover, all of the photonic crystals were formed in the cladding layer in the present example, but the photonic crystals could also be formed in the SCH layer. Moreover, a photonic crystal including an active layer as a part of the photonic crystal, and an active layer itself made to be a photonic crystal could be used.

Second Example

Figure 10:
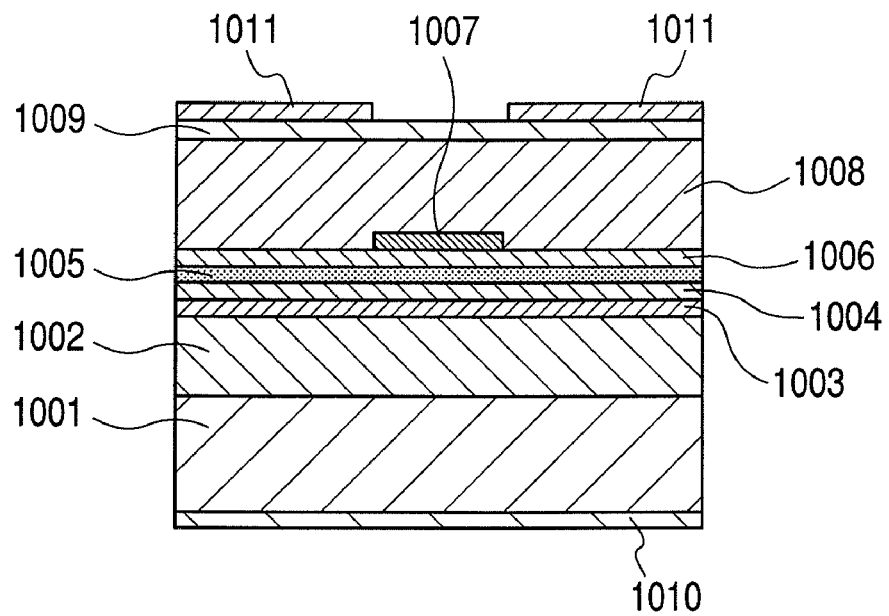
FIG. 10 is a sectional view illustrating the configuration of a surface emitting laser of a second example of the present invention when it is viewed from a direction parallel to the substrate thereof.

In the first example described above, the configuration example in which the first and second photonic crystal regions were formed in the same photonic crystal layer has been described. In a second example, these two regions were provided to different photonic crystal layers, and a surface emitting laser device in the form of being separated into an upper part and a lower part is described. FIG. 10 illustrates a view for illustrating the configuration of a surface emitting laser of the present example.

FIG. 10 is a sectional view illustrating the configuration of a surface emitting laser in the present example at the time of being viewed in a direction parallel to the substrate of the surface emitting laser.

As illustrated in FIG. 10, the surface emitting laser included a substrate 1001, a lower cladding layer 1002, a first photonic crystal region 1003, a lower SCH layer 1004, an active layer 1005, an upper SCH layer 1006, a second photonic crystal region 1007, an upper cladding layer 1008, an upper cladding layer cap layer 1009, an n electrode 1010, and a p electrode 1011.

In the present example, all the configurations, the sizes, and the materials of the device were the same as those of the first example except for the first and the second photonic crystal regions and the active layer. Only the parts different from those of the first example will be described in the following.

The present example was configured to provide the first and the second photonic crystal regions in different layers by being separated from the same plane.

The first photonic crystal region 1003 was adjacent to the lower SCH layer 1004.

Moreover, the second photonic crystal region 1007 was formed above the upper SCH layer 1006 by 150 nm in comparison with that of the first example, and the second photonic crystal region 1007 was configured to be embedded in the upper cladding layer 1008.

Incidentally, the parameters such as the lattice constants and the hole radii were all the same as those of the first example.

Also as the functions, similarly to those of the first example, a laser light oscillated in the first photonic crystal region 1003 was diffracted in the second photonic crystal region 1007 to be emitted into a perpendicular direction.

At that time, because the first photonic crystal region 1003 existed in the lower part of the second photonic crystal region 1007 in the present example, respective modes were mixed to be coupled with each other in the light diffraction regions.

Similarly to the first example, the first photonic crystal in the region 1003 was designed to enlarge the resonance within the plane, and the second photonic crystal of the region 1007 was designed so that the diffraction in the direction perpendicular to the plane might take an appropriate value. Consequently, those characteristics coexisted in the present example. Consequently, the feedback effect within the plane did not decreased in comparison with the case of configuring the region only by the second photonic crystal. Moreover, because the second photonic crystal also had the resonance effect within the plane, the resonance components within the plane of both of the first and the second photonic crystal regions were added to produce the resonance effect equal to or more than that in the first photonic crystal region.

According to the configuration of the present example, because the photonic crystal region for resonance (region 1003) and the photonic crystal region for diffraction (region 1007) were separated into the different layers, the efficient of oscillation and diffraction could be controlled according to the distances of the respective layers from the active layer.

Figure 15:
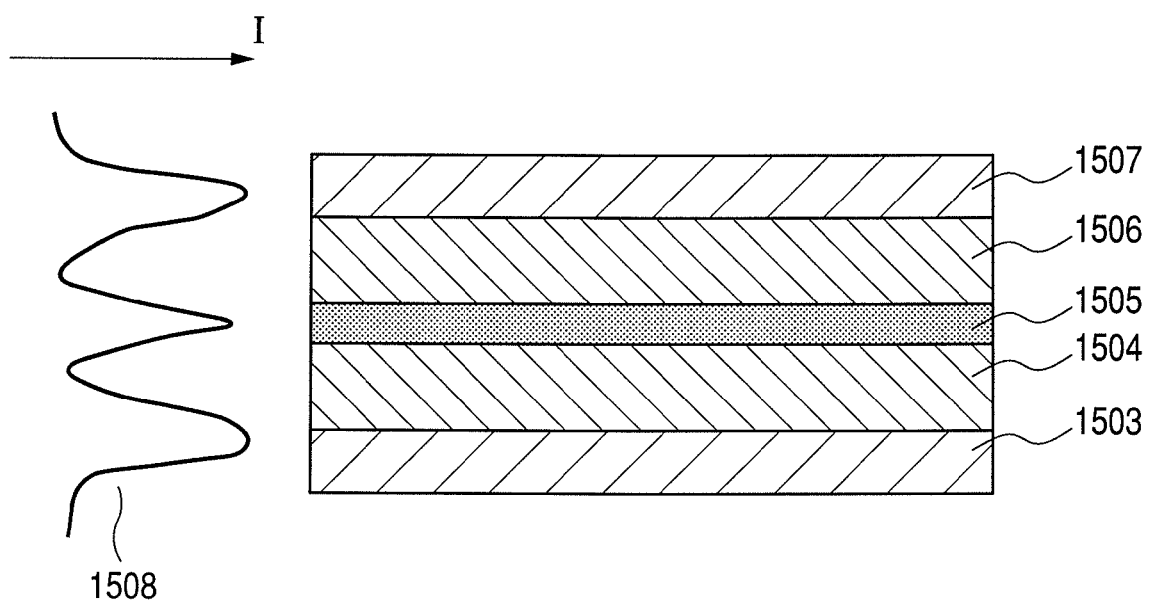
FIG. 15 is a view illustrating a distribution of light when a 2nd waveguide mode is used for resonance light and positional relationships among photonic crystals, SCH layers, and an active layer in the surface emitting laser in the second example of the present invention.

Incidentally, the resonance of light used the $0^{th}$ order waveguide mode in the present example, but the higher order waveguide modes could be used. For example, the case that $2^{nd}$ waveguide mode is used is explained. FIG. 15 is an enlarged view of the central part of the view in FIG. 10. The central part included the first photonic crystal region 1503, the lower SCH layer 1504, the active layer 1505, the upper SCH layer 1506, and the second photonic crystal region 1507. An electric field intensity distribution 1508 of the $2^{nd}$ waveguide mode is illustrated. The electric field intensity distribution 1508 had local maximums of the electric field distribution at each of the first and the second photonic crystal regions and the active layer 1505. By using such a mode, the first and the second photonic crystal regions could have larger electric field distributions while holding a larger electric field distribution in the active layer, and consequently the feedback effect was more intensified in comparison with the case of the $0^{th}$ order in the same waveguide configure.

The guided wave of such a $2^{nd}$ mode was performed by adjusting the thicknesses of the active layer 1505, the lower SCH layer 1504, the upper SCH layer 1506, the first photonic crystal region 1503, and the second photonic crystal region 1507.

To put it concretely, the sum of all of the thicknesses of the aforesaid layers (=the thickness of the waveguide layer) was adjusted to be a certain value or more in consideration of the value of the refractive index of each layer. The certain value could be obtained on the basis of the theory of light propagation by using the actual refractive index at each layer.

In the present example, all of the photonic crystals were formed in the cladding layers. But the photonic crystals could be formed in the SCH layers. Moreover, the photonic crystals could include an active layer partially, or the active layer itself could be used as the photonic crystal. Generally, the photonic crystal for resonance (region 1503) could suitably have larger confined components of light as the photonic crystal was situated closer to the active layer.

Moreover, the photonic crystal for light diffraction (region 1507) could control the diffraction efficient of light also by controlling the distance between the active layer and the light diffracting portion.

Incidentally, an appropriate distance could suitably be set between the active layer and the photonic crystal for light diffraction (region 1507) so that the diffraction efficient at the diffraction portion might have an appropriate value.

Moreover, as described above, because the resonance component within the plane in the second photonic crystal region was strong and the active layer, which did not receive current injection, in the region works as the absorption layer in the present example, loss became larger.

Consequently, the active layer just under the second photonic crystal region could be removed, and the loss could be reduced by providing an $Al_{0.8}Ga_{0.2}As$ layer having the same refractive index and the same thickness as those of the active layer.

As for the manufacturing method of laser device of the present example, the laser device may be manufactured by using a known processes, which are the same kind as those of the first example, basically.

Moreover, the separation of the first and the second photonic crystal regions to the different layers could be realized by more number of times bonding processes and re-growing processes than the first example.

Third Example

As a third example, a surface emitting laser equipped with one or more light emitting regions is described.

Figure 11:
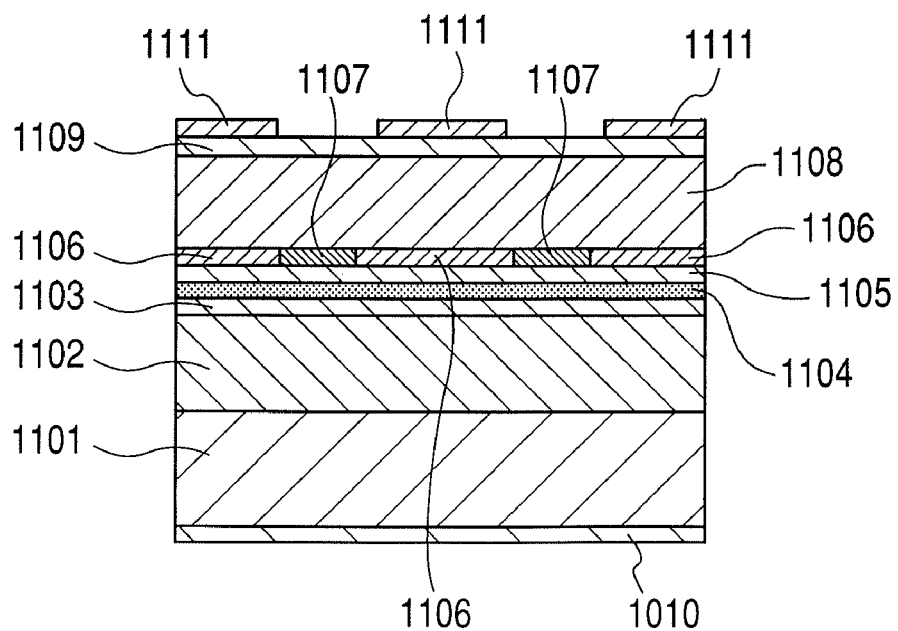
FIG. 11 is a sectional view illustrating the configuration of a surface emitting laser of a third example of the present invention when it is viewed from a direction parallel to the substrate thereof.

FIG. 11 is a view illustrating the configuration of the surface emitting laser of the present example.

FIG. 11 is a sectional view illustrating the configuration of the surface emitting laser of the present example when the surface emitting laser is viewed in the direction parallel to the substrate thereof.

As illustrated in FIG. 11, the surface emitting laser included the substrate 1101, the lower cladding layer 1102, the lower SCH layer 1103, the active layer 1104, and the upper SCH layer 1105.

The surface emitting laser further included a first photonic crystal region 1106, and second photonic crystal regions 1107.

The surface emitting laser still further includes an upper cladding layer 1108, a cap layer 1109, an n electrode 1110, and a p electrode 1111.

All of the materials and the sizes constituting the device were similar to those of the first example except for the provision of a plurality of light emitting regions in the present example.

In the device of the present example, the method of arranging the photonic crystals was important. In the following, the method is described.

Figure 12A:
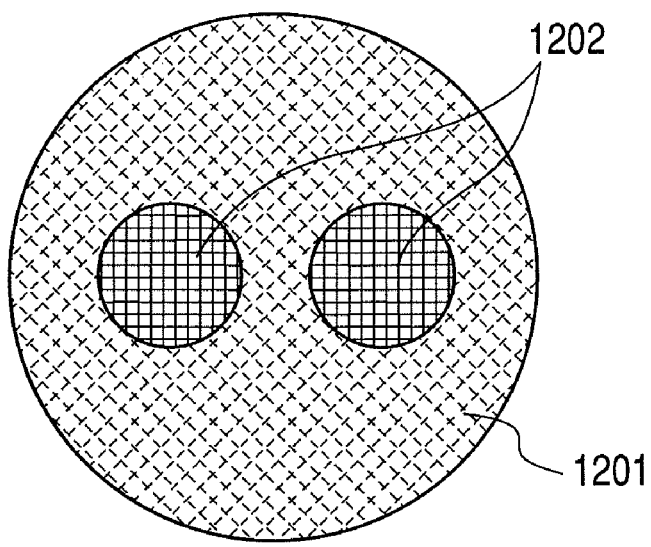
Figure 12B:
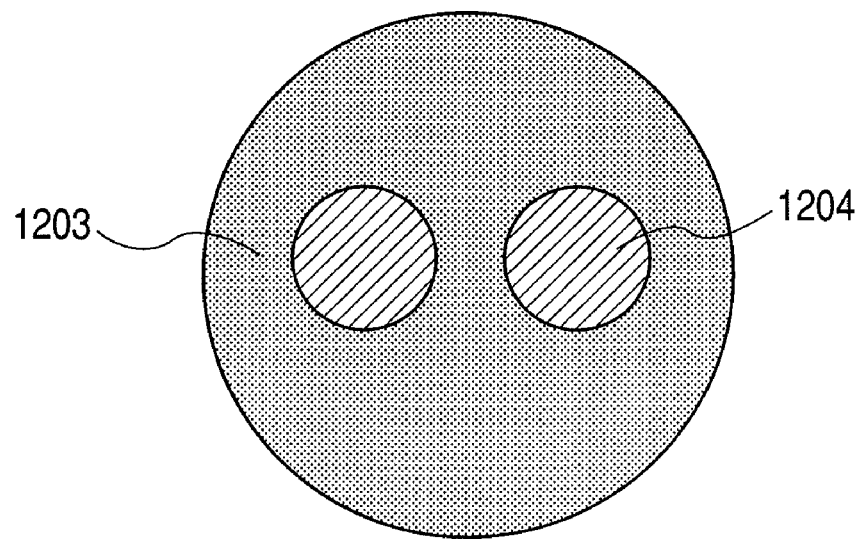

FIGS. 12A and 12B are views illustrating the photonic crystal layers of the present example.

FIG. 12A is a sectional view illustrating the whole photonic crystal layer in the surface emitting laser when the photonic crystal layer is viewed in the direction perpendicular to the substrate.

As illustrated in FIG. 12A, the photonic crystal layer included a first photonic crystal region 1201 and second photonic crystal regions 1202.

The present example was configured so that the second photonic crystal regions 1202 at two positions might be enclosed by the first photonic crystal region 1201.

The structure of a p electrode in the present example is next described with reference to FIG. 12B.

FIG. 12B is a view illustrating the laser device of the present example when the laser device is viewed from the upper direction thereof. The laser device included a p electrode 1203 and aperture portions 1204. Also in the present example, similarly to the first example, no electrodes were provided above the second photonic crystal regions 1202 for light diffraction, and formed as the apertures. Although there were two aperture portions in the present example, further more apertures could be formed.

The laser device in the present example could be manufactured by similar process techniques to those of the first example.

When the laser device of the present example was electrified, laser lights were simultaneously emitted from the two aperture portions in the same phases. The wavelengths of the laser lights were 670 nm similarly to that of the first example. The surface emitting laser emitting coherent laser lights from a plurality of aperture portions like the present example could separate the light from each of the apertures into several portions to be used.

For example, the light from a certain aperture could be used as a light source, and then the light from the remaining aperture could be used as the light for monitoring the output.

Incidentally, in the case of forming a plurality of aperture portions, the regions 1202 must be adjacent to the region 1201, which is the supply source of the laser light. In this case, in order to form the emitting spots to be approximately circular shapes, the regions 1202 could suitably configure closed regions enclosed by the region 1201. The circular emitting spots had the merits of the easiness of the coupling of optical fibers using optical systems such as lenses, and the like.

Fourth Example

In a fourth example, a surface emitting laser provided with a reflection adjusting layer is described.

Figure 13:
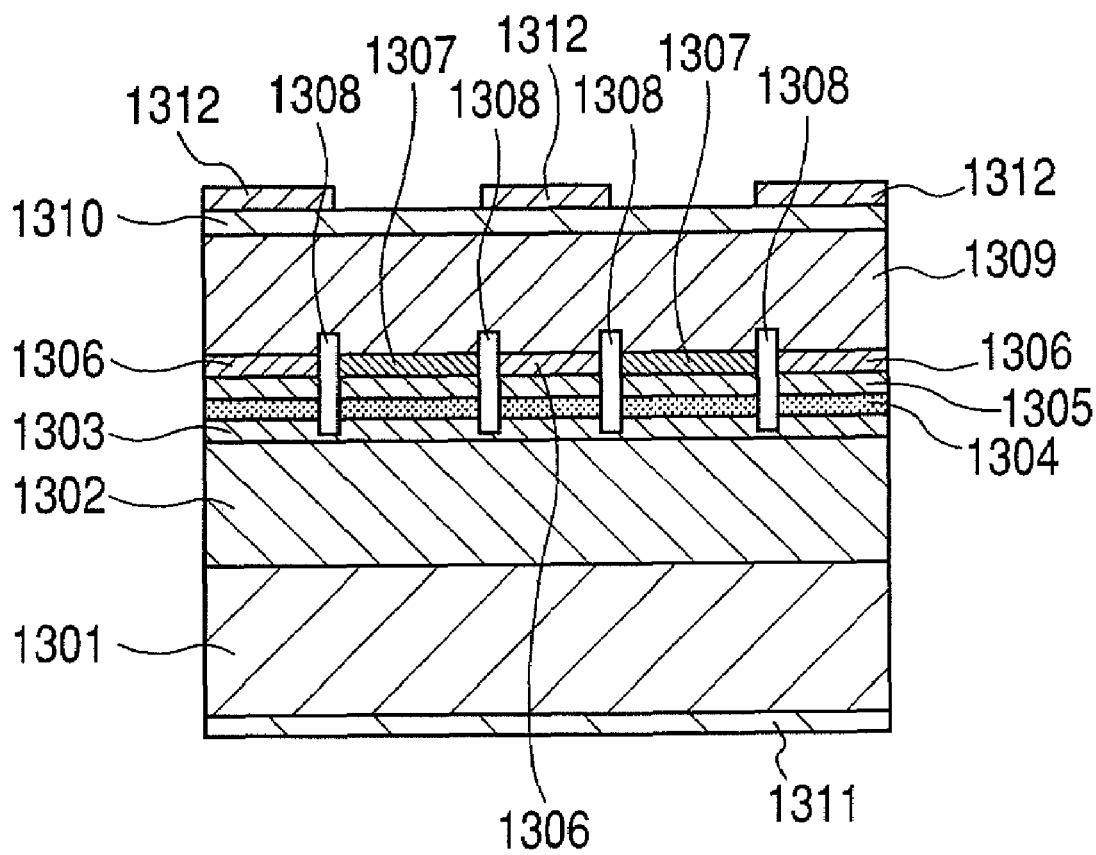
FIG. 13 is a sectional view illustrating the configuration of a surface emitting laser of a fourth example of the present invention when it is viewed in a direction parallel to the substrate thereof.

FIG. 13 is a view for illustrating the configuration of the surface emitting laser of the present example.

FIG. 13 is a sectional view illustrating the configuration of the surface emitting laser of the present example when the surface emitting laser is viewed in the direction parallel to the substrate thereof.

As illustrated in FIG. 13, the surface emitting laser included a substrate 1301, a lower cladding layer 1302, a lower SCH layer 1303, an active layer 1304, an upper SCH layer 1305, a first photonic crystal region 1306, second photonic crystal regions 1307, photonic crystal boundary reflection adjusting layers 1308, an upper cladding layer 1309, an upper cladding layer cap layer 1310, an n electrode 1311, and a p electrode 1312.

The present example was configured to newly introduce the photonic crystal boundary reflection adjusting layers 1308 on the boundary surfaces in the first and the second photonic crystal regions in addition to the configuration of the device of the first example.

Because the configuration, the sizes, and the materials of the other elements were all similar to those of the first example, only the parts different from those of the first example are described in the following.

Figure 14A:
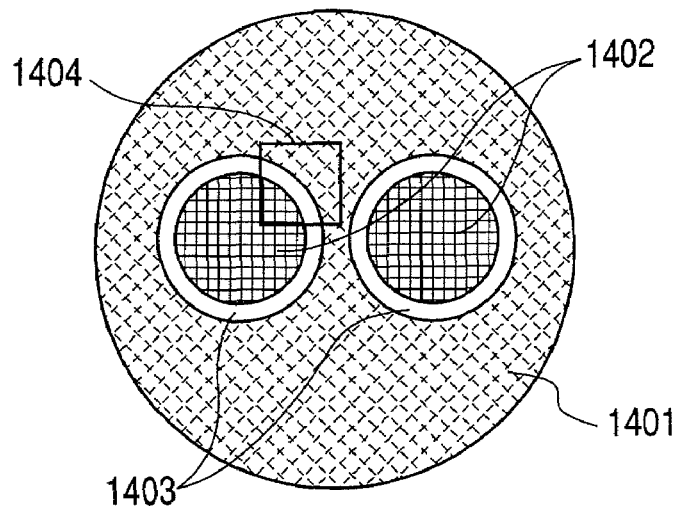
Figure 14B:
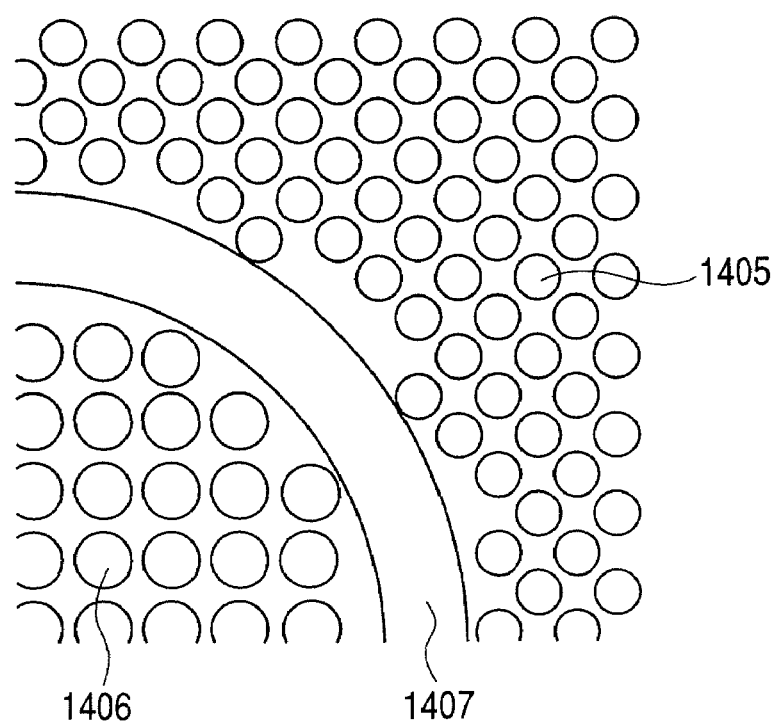

FIGS. 14A and 14B are views illustrating the photonic crystals of the present example.

FIG. 14A is a sectional view of the photonic crystal layers in the surface emitting laser when the photonic crystal layers are viewed in the direction perpendicular to the substrate of the surface emitting laser.

As illustrated in FIG. 14A, the surface emitting laser included a first photonic crystal region 1401, a second photonic crystal regions 1402, and photonic crystal boundary reflection adjusting layers 1403. An enclosure 1404 expresses the region illustrated in FIG. 14B.

FIG. 14B is an enlarged view of the region 1404 illustrated in FIG. 14A.

The region 1404 included first photonic crystal region holes 1405, second photonic crystal region holes 1406, and a photonic crystal boundary reflection adjusting layer 1407.

In the present example, the photonic crystal boundary reflection adjusting layers introduced into the first and the second photonic crystal regions was formed as circular deep grooves, and air or a nitrogen gas was filled up in the photonic crystal boundary reflection adjusting layers.

The functions of the photonic crystal boundary reflection adjusting layers were to enlarger the reflection at the boundary surfaces owing to the differences of the refractive indices of the adjusting layers when the laser light oscillated in the first photonic crystal region was guided into the second photonic crystal region.

Thereby, the ratio of the light to be guided to the second photonic crystal region decreased, and the light was confined in the first photonic crystal region for a longer time.

Because the threshold current of a laser becomes lower as the time during which a light is resonating becomes longer, the further improvement of the performance of a laser device is enabled by adopting the configuration like the present example.

However, if the reflection is raised too much to take out the light, the state is not preferable for a laser device. In order to prevent this phenomenon, the reflection in the boundary regions can be adjusted by adjusting the medium to be filled up in the grooves.

In the present example, simply increasing the reflection is not good, and controlling the reflection is important.

The control had not been realized until the configuration in which the light reflection layers was provided to the laser device of the present invention was used. The control is different in the nature from the technique of the first patent document, in which it is more desirable that reflection becomes higher.

Moreover, the adjustment layers were formed to be deep grooves penetrating three layers of from the photonic crystal layer to the upper SCH layer 1305, the active layer 1304, and the lower SCH layer 1303 in order to operate the effect of the grooves to all the light components propagating around the active layer similarly to the first patent document. The sizes of each of the grooves were 150 nm in width and 400 nm in depth.

The manufacturing method of the device by the present example is described. Also in the present example, the device can be manufactured by using the similar manufacturing technique to that of the first example. The thing required to the present example was only to add the EB rendering process and the dry etching process for manufacturing the boundary reflection layers.

In the present example, although the groove structure of filling up a gas such as air or a nitrogen gas was adopted as structure of each the photonic crystal boundary reflection layers, the materials to be filled up in order to adjust the reflection may be a dielectric, a semiconductor, a transparent conductor, an the like, besides the gas.

At that time, the refractive index of the material to be filled up is required to be different from that of the medium having a high refractive index among the media constituting the photonic crystal.

The reflection becomes larger as the difference between the refractive indices of both the media becomes larger, but the difference between the refractive indices of both the media can suitably be enlarged because the reflection can be adjusted by the width of each of the grooves.

Moreover, by filling up a liquid crystal, which can control the refractive index dynamically, the dynamic control of the reflection is also enabled.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-128774, filed May 15, 2007, which is hereby incorporated by reference herein in its entirety.

What is claimed is:

1. A surface emitting laser device comprising:
   an active layer;
   a photonic crystal layer, which has a two-dimensionally periodic refractive index structure, and which is disposed adjacent to the active layer;
   an electrode disposed on the photonic crystal layer; and a light emitting region for emitting light,
wherein the photonic crystal layer includes:
- a first photonic crystal region disposed under the electrode, and having a periodic refractive index structure for resonance of light within a plane, and
- a second photonic crystal region disposed under the light emitting region, and having a periodic refractive index structure for emitting light in a direction perpendicular to the plane, wherein the photonic crystal has a structure wherein cylindrical holes are arranged in a square grating in a medium, wherein a lattice constant of the first photonic crystal region is about $(1/2)^{1/2}$ times as large as a lattice constant of the second photonic crystal region, and wherein a crystal orientation of the first photonic crystal region is at an angle of 45° to a crystal orientation of the second photonic crystal region.

2. The surface emitting laser device according to claim 1, wherein the second photonic crystal region includes a photonic crystal having a mode of a photonic band at a Γ point, and the first photonic crystal region includes a photonic crystal having a mode of a photonic band at a photonic band edge other than at a Γ point and lower than a light line.

3. The surface emitting laser device according to claim 1, wherein the first and second photonic crystal regions are formed in a same photonic crystal layer.

4. The surface emitting laser device according to claim 1, wherein the first and second photonic crystal regions are formed respectively in different photonic crystal layers, so as to be divided in a direction perpendicular to the plane.

5. The surface emitting laser device according to claim 1, wherein more than one light emitting region is provided.

6. The surface emitting laser device according to claim 1, wherein a reflection controlling structure is formed between the first photonic crystal region and the second photonic crystal region.

7. A surface emitting laser device comprising:
- an active layer;
- a photonic crystal layer, which has a two-dimensionally periodic refractive index structure, and which is disposed adjacent to the active layer;
- an electrode disposed on the photonic crystal layer; and
- a light emitting region for emitting light, wherein the photonic crystal layer comprises:
- a first photonic crystal region disposed under the electrode, and having a periodic refractive index structure for resonance of light within a plane, and
- a second photonic crystal region disposed under the light emitting region, and having a periodic refractive index structure for emitting light in a direction perpendicular to the plane, wherein the photonic crystal has a structure wherein cylindrical holes are arranged in a triangle grating in a medium, wherein a lattice constant of the first photonic crystal region is about $(1/3)^{1/2}$ times as large as a lattice constant of the second photonic crystal region, and wherein a crystal orientation of the first photonic crystal region is at an angle of 30° to a crystal orientation of the second photonic crystal region.

8. The surface emitting laser device according to claim 7, wherein the second photonic crystal region includes a photonic crystal having a mode of a photonic band at a Γ point, and the first photonic crystal region includes a photonic crystal having a mode of a photonic band at a photonic band edge other than at a Γ point and lower than a light line.

9. The surface emitting laser device according to claim 7, wherein the first and second photonic crystal regions are formed in a same photonic crystal layer.

10. The surface emitting laser device according to claim 7, wherein the first and second photonic crystal regions are formed respectively in different photonic crystal layers, so as to be divided in a direction perpendicular to the plane.

11. The surface emitting laser device according to claim 7, wherein more than one light emitting region is provided.

12. The surface emitting laser device according to claim 7, wherein a reflection controlling structure is formed between the first photonic crystal region and the second photonic crystal region.

* * * * *